United States Patent [19]

Sullivan et al.

[11] Patent Number: 5,004,399
[45] Date of Patent: Apr. 2, 1991

[54] ROBOT SLICE ALIGNING END EFFECTOR

[75] Inventors: Harold W. Sullivan, Dallas; Pat M. McConnell, Lucas, both of Tex.

[73] Assignee: Texas Instruments Incorporated, Dallas, Tex.

[21] Appl. No.: 378,496

[22] Filed: Jul. 11, 1989

Related U.S. Application Data

[63] Continuation of Ser. No. 93,327, Sep. 4, 1987, abandoned.

[51] Int. Cl.⁵ .............................................. B25J 11/00
[52] U.S. Cl. .................................... 414/729; 414/737; 414/744.7; 414/783; 414/225; 901/30; 901/40
[58] Field of Search ........................................ 414/729

[56] References Cited

U.S. PATENT DOCUMENTS

| | | | |
|---|---|---|---|
| 3,651,957 | 3/1972 | Ball et al. | 294/64.1 X |
| 3,727,773 | 4/1973 | Wolfe, Jr. | 414/704 |
| 4,135,630 | 1/1979 | Snyder et al. | 414/737 X |
| 4,226,569 | 10/1980 | Gerard et al. | 414/783 X |
| 4,383,789 | 5/1983 | Takamatsu | 414/741 X |
| 4,457,664 | 7/1984 | Judell et al. | 414/757 X |
| 4,597,708 | 7/1986 | Wheeler et al. | 414/752 X |
| 4,620,738 | 11/1986 | Schwartz et al. | 294/64.1 |
| 4,674,621 | 6/1987 | Takahashi | 414/225 X |
| 4,676,884 | 6/1987 | Dimock et al. | 414/225 X |
| 4,682,928 | 7/1987 | Foulke et al. | 414/737 X |
| 4,699,556 | 10/1987 | Foulke | 414/783 X |
| 4,705,311 | 11/1987 | Ragard | 294/64.1 X |
| 4,720,130 | 1/1988 | Andou | 901/40 X |
| 4,723,353 | 2/1988 | Monforte | 901/30 X |

FOREIGN PATENT DOCUMENTS

| | | | |
|---|---|---|---|
| 192994 | 9/1986 | European Pat. Off. | 414/737 |
| 2211245 | 9/1987 | Japan | 414/752 |

Primary Examiner—Robert J. Spar
Assistant Examiner—William M. Hienz
Attorney, Agent, or Firm—Gary C. Honeycutt; Melvin Sharp; N. Rhys Merrett

[57] ABSTRACT

An end effector (10) is pivotally affixed to a robot arm (12) and comprises a platform (28) and a catcher (42). In operation, the end effector (10) picks up an integrated circuit slice (S), tilts the platform (28) away from the horizontal, causing the slice (S) to slide into an indexing surface (47) of the catcher (42). This places the slice (S) in a predetermined position relative to the robot arm (12) allowing for precise placement of the slice (S) at a workstation (106).

34 Claims, 4 Drawing Sheets

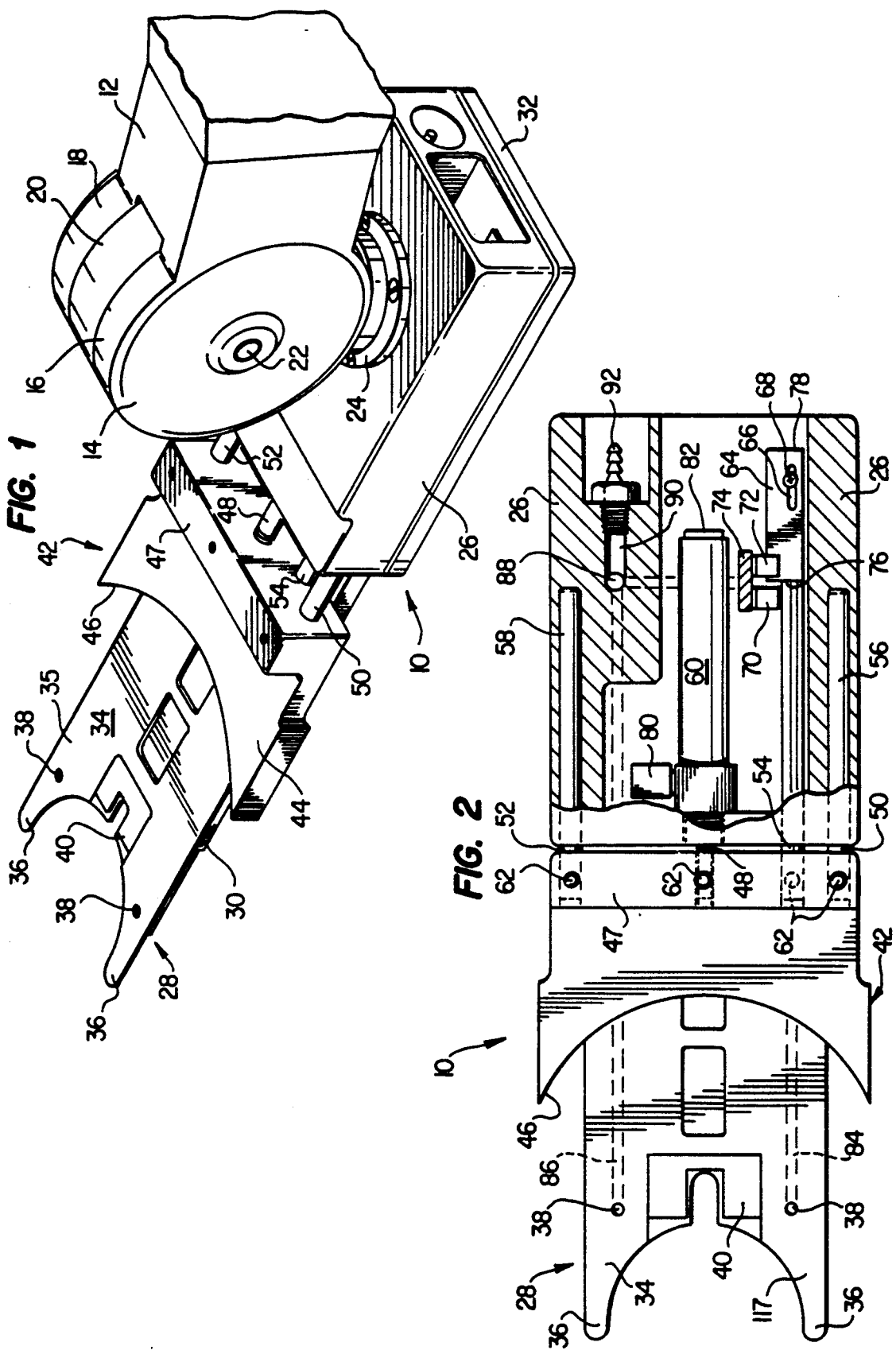

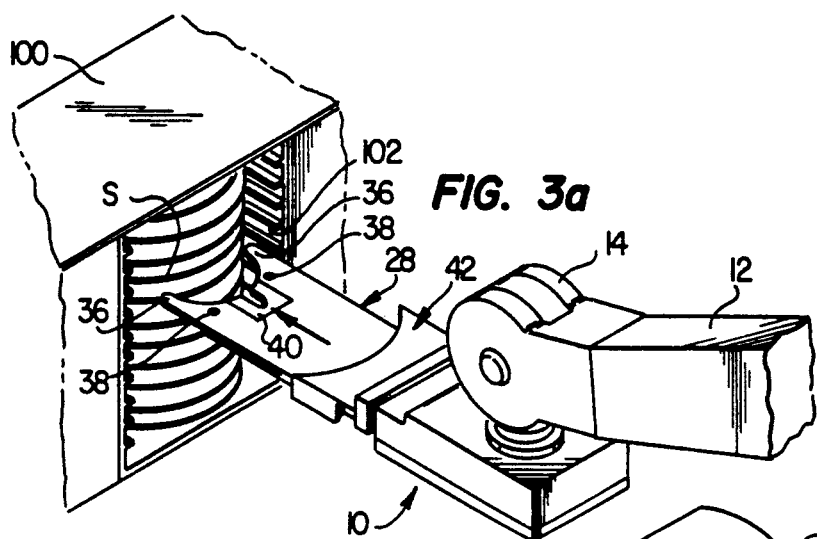
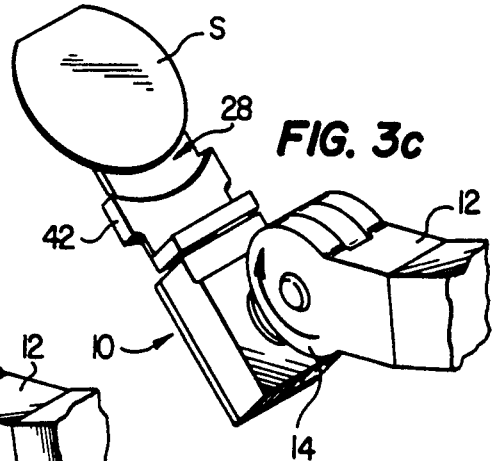
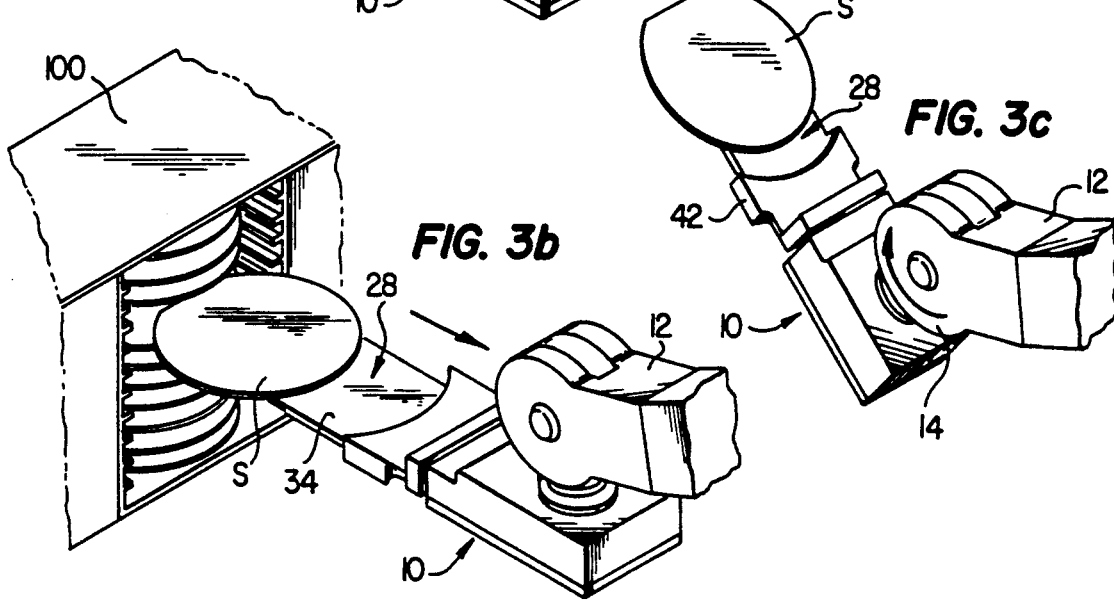
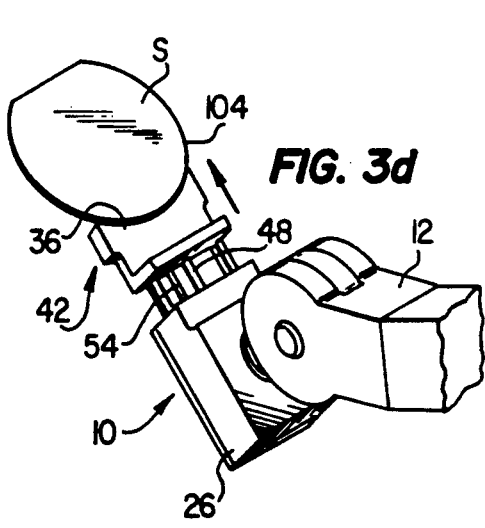
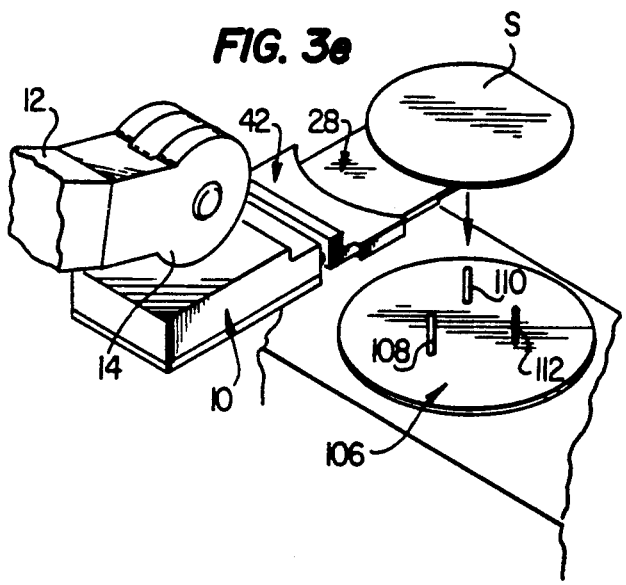

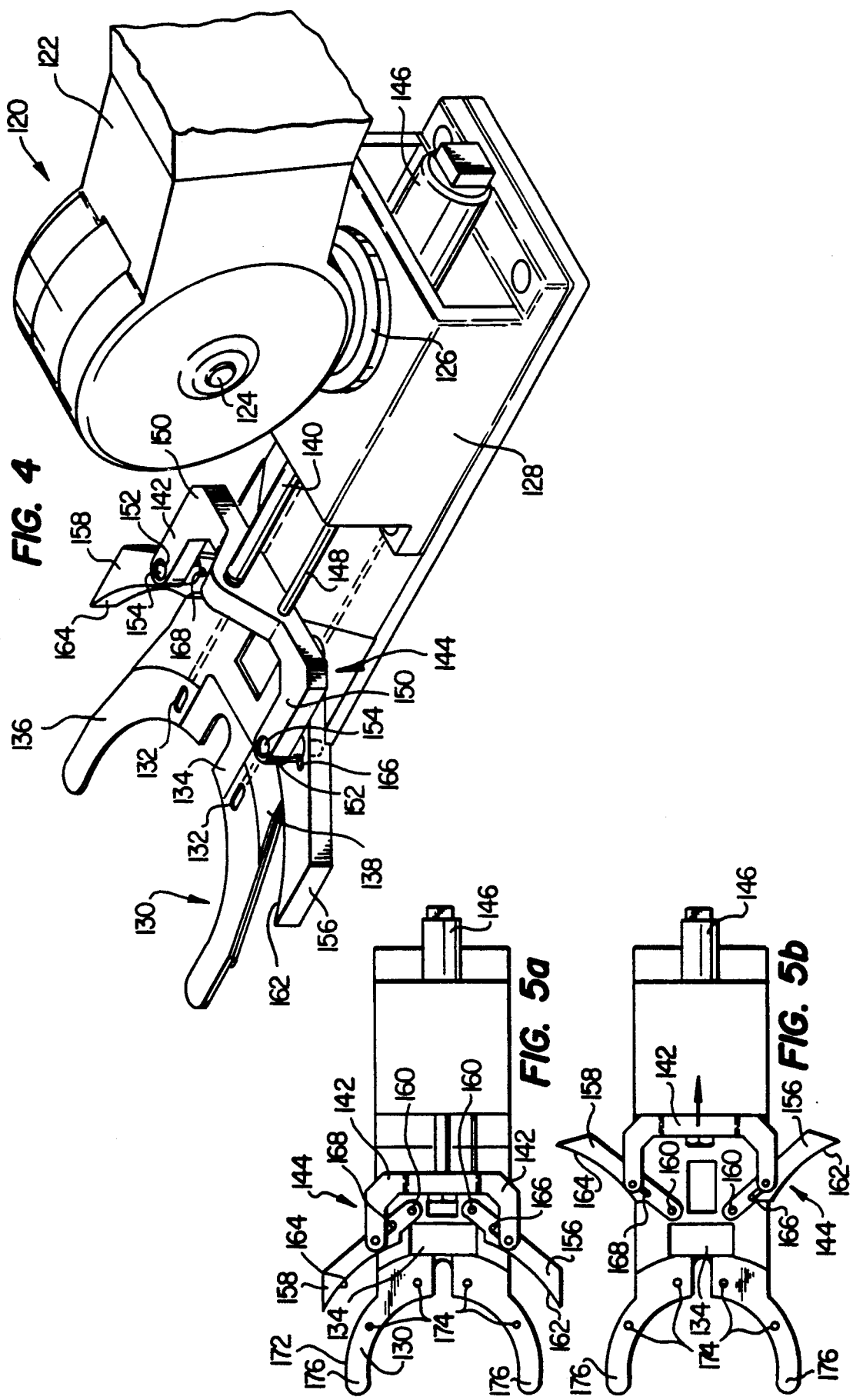

ROBOT SLICE ALIGNING END EFFECTOR

This application is a Continuation, of application Ser. No. 07/093,327, filed Sept. 4, 1987, now abandoned.

TECHNICAL FIELD OF THE INVENTION

This invention relates in general to end effectors for transporting integrated circuit slices, and more particularly relates to end effectors having the capability of aligning a retrieved slice to a predetermined position relative to the effector

BACKGROUND OF THE INVENTION

Integrated circuits are typically manufactured on disk-like semiconductor slices. There are certain types of manufacturing equipment that need to have the slice precisely centered in relation to them. Such equipment includes photoresist and develop spinners, since these devices rotate at a high speed. Conventionally, this type of equipment is loaded by air or by rubber band tracks and the slice is transported into a separately provided aligner or slice locator.

In modern integrated circuit slice fabrication, it has always been desirable to reduce contamination of the slice surface on which the integrated circuit is formed. One method for accomplishing this is to manipulate the silicon slice in a contaminant-free enclosure by a robot arm. However, using a robot as the slice transporter to ram the slice into a slice locator is not practical. Another approach using robot manipulation is to set the slice on another centering mechanism which does the alignment, picking the slice off this mechanism with the robot arm, and continuing on to the next workstation.

Thus, conventional solutions to centering using robot manipulation have the disadvantages of requiring a separate device that can cost several thousand dollars, further robot moves which have to be taught to the robot, and several additional steps of picking up and putting down the slice, all of which generate additional contaminating particles and slow down the process throughput.

A need has therefore arisen in the industry for a method and apparatus for aligning a slice relative to a robot end effector that does not require additional devices, is relatively simple to implement, and is compatible with robot manipulation

SUMMARY OF THE INVENTION

One aspect of the present invention comprises apparatus for positioning a workpiece, such as an integrated circuit slice, relative to a workpiece carrier. A platform of the end effector is provided so that the workpiece can be placed thereon. The carrier has a mechanism for tilting the platform away from the horizontal once the platform has obtained a workpiece. Responsive to tilting the platform away from the horizontal, the workpiece slides toward an indexer of the carrier such that at least one side of the workpiece abuts it. The registration of the workpiece side with the indexer provides a principal advantage of the invention in that it puts the workpiece in a predetermined position relative to the carrier.

According to another aspect of the invention, the platform of a preferred end effector includes a mechanism for releasably affixing a slice to the platform. Preferably, this mechanism takes the form of a plurality of vacuum ports that create a partial vacuum between an upper surface of the platform and a lower surface of the slice. Vacuum channels or the like couple the vacuum ports to a vacuum source, which further preferably has a vacuum sensor for sensing the establishment of a vacuum at the vacuum ports. The sensor provides a technical advantage in that it provides an indication that the platform has retrieved a slice.

The indexer of the end effector may either be stationary, or may be movable between an indexing position and a rest position such that the end effector can advantageously access relatively tight places, such as slice cassettes. One embodiment of an end effector having a movable indexer includes a slide that laterally moves an indexing surface of the indexer forward to an indexing position, and retracts the surface to a rest position. Another embodiment of the movable indexer is operable to pivot a plurality of indexing calipers to an indexing position, and retract the calipers from the indexing position backward to a rest position.

The end effector of the invention may further include a capacitive sensor mounted on the platform for sensing the presence of a slice on the platform.

In a positioning method according to the invention, the workpiece or slice is first picked up by the effector platform. Then, the platform is tilted away from the horizontal, causing the workpiece to slide into the indexer. Once a side of the workpiece abuts the indexing points, the workpiece will be in a predetermined position relative to the effector.

According to a preferred method, the workpiece is held in place both prior to the step of sliding the workpiece into the indexer and subsequent to the step of abutting the workpiece into the indexer. The carrier or effector also preferably returns toward a horizontal position after the step of abutting has been completed. Where the presence of the indexer in the indexing position would inhibit the use of the effector to access relatively tight places, the method further includes the steps of extending the indexer forward to an indexing position, and retracting the indexer backward after the step of abutting.

In this manner, in only six operations of the robot, i.e., upwardly tilting the effector, extending the indexer, releasing the slice to abut the indexer, returning the end effector to the horizontal, retracting the indexer and switching the affixing mechanism back on, the robot is able to perform an alignment or positioning of the workpiece or integrated circuit slice inexpensively and in a relatively short time. This provides the technical advantages of eliminating several robot moves and further expensive apparatus, and increasing production throughput.

BRIEF DESCRIPTION OF THE DRAWINGS

Further aspects of the present invention will be ascertained with reference to the following detailed description in conjunction with the appended drawings in which:

FIG. 1 is an isometric view of a first embodiment of an end effector of the invention, shown in conjunction with a portion of a robot arm to which the effector is attached, a catcher of the effector shown in an extended position;

FIG. 2 is a plan view of the end effector shown in FIG. 1, the catcher of the end effector shown in a retracted position, with parts broken away and certain components shown in phantom;

FIGS. 3a-3f are sequential isometric schematic views of an end effector after FIG. 1, showing sequential steps in a method of transferring and centering an integrated circuit slice according to the invention;

FIG. 4 is an isometric view of a second embodiment of an end effector according to the invention, as attached to a partially shown robot arm and showing a catcher of the end effector in an extended position;

FIG. 5a is a simplified plan view of an end effector similar to the embodiment shown in FIG. 4, with the catcher thereof extended in an indexing position; and FIG. 5b is a plan view of the end effector as shown in FIG. 5a, showing the catcher in a retracted rest position.

DETAILED DESCRIPTION

Figure 3F:
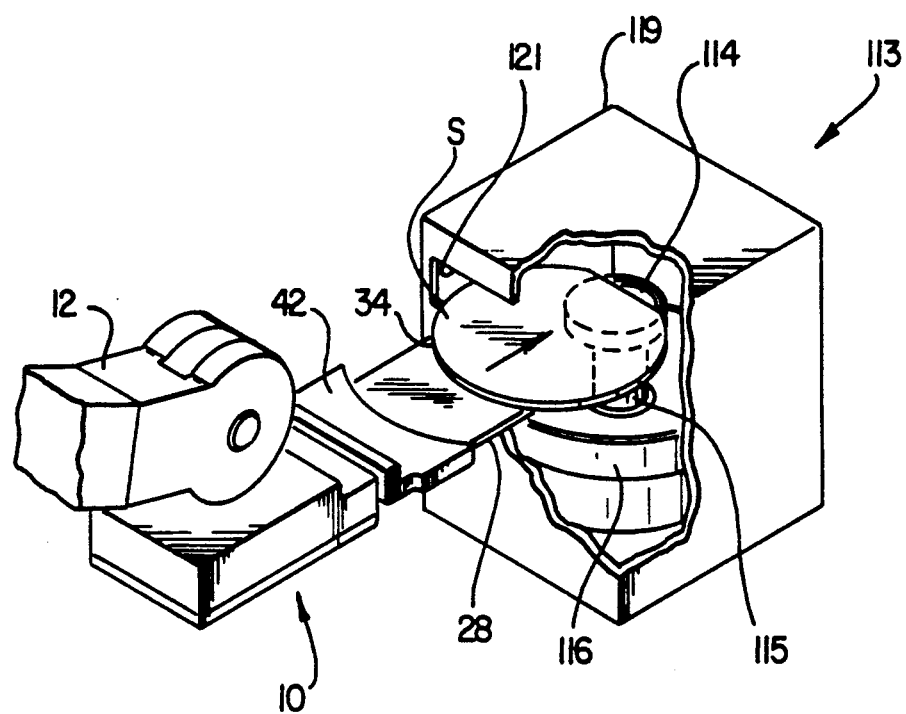

Referring first to FIG. 1, a first embodiment of an end effector according to the invention is shown generally at 10. End effector 10 is depicted as used in conjunction with a robot arm 12. Robot arm 12 in the illustrated embodiment terminates in a pivot 14. Pivot 14 is comprised of a pair of fixed disc members 16 and 18 in relation to which a disc-like pivot member 20 rotates. An axle 22 rotatably affixes rotating member 20 with respect to discs 16 and 18, and is equipped with suitable motor elements, bearings and a radial position sensor (not shown). A collar 24 is affixed to rotating disc 20, and is itself affixed as by screws to a housing 26 of effector 10. Effector 10 is therefore operable to be rotated in its entirety around axle 22 in a vertical plane.

Effector 10 has a platform or blade indicated generally at 28 that projects outwardly from housing 26. In the illustrated embodiment, a lower plate 30 of blade 28 is an integral extension of a lower plate 32 of housing 26. Platform or blade 28 further is comprised of an upper plate 34 that is generally coextensive with lower plate 30. Upper plate 34 is affixed to lower plate 30 by such means as screws. An upper surface 35 of upper plate 34 has a large flat area for supporting an integrated circuit slice (not shown).

Preferably, platform 28 has a width that is less than the diameter of the integrated circuit slice so that contact with the edge or sidewall of the slice is avoided. Contact with the sidewall is minimized in order to prevent the sloughing of such materials as photoresist from the upper surface of the slice on to the end effector.

Platform 28 preferably has two prong or fork portions 36 that are separated by a large space. Forks 36 are formed such that the platform 28 can extend underneath the slice sufficiently to support the slice in a stable manner, while at the same time reducing the contact of the upper surface of upper plate 34 with the lower surface of the slice. Forks 36 also allow platform 28 to be inserted around a post supporting the slice, as will be detailed below.

Platform 28 is further preferably provided with a plurality of vacuum ports 38 that are connected by means of channels to a vacuum source, the channels and vacuum source to be described below. Vacuum ports 38 are a preferred means of affixing a slice to upper surface 35 during the performance of various operations by effector 10 and robot arm 12.

A capacitive or "taste bud" sensor 40 is preferably recessed into upper plate 34, and is provided to capacitively sense the presence of a slice on upper surface 34. Capacitive sensor 40 is preferably fabricated of fiberglass with a coating of copper. The copper is coated onto the fiberglass to create two circuit components: a peripheral copper lead around the perimeter of the sensor (not shown), and a central copper pad (not shown) in the middle of the sensor that is spaced from the peripheral copper lead. The capacitance between these two conductive elements will change in the proximity of semiconductor material, thereby generating a signal that is transmitted by appropriate conductors (not shown) to a sensor circuit that can be located in housing 26 or elsewhere in the robot.

Effector 10 further comprises a catcher indicated generally at 42. In the embodiment illustrated in FIG. 1, catcher 42 comprises an integral body 44 with a concave surface 46 on its front end. Body 44 has a rear block 47 that is affixed to a pusher rod 48. Block 46 is further affixed to left and right side guides 50 and 52, and further to a position sensor rod 54. The ends of shafts 48, 50, 52 and 54 are preferably inserted into respective bores in block 46, and are affixed to block 46 by means such as screws 62.

In FIG. 2, the end effector of FIG. 1 is shown in plan view with parts broken away to show greater detail. Robot arm 12 has been omitted in this view. Guides 50 and 52 slideably reciprocate into respective left and right guide bores 56 and 58. Pusher rod 48 is affixed to the end of a piston (not shown) that in turn sealably reciprocates inside of a cylinder 60. Cylinder 60 is preferably a bi-directional vacuum cylinder, such that the application of a vacuum to either end of the cylinder will cause pusher rod 48 to slide in and out as desired. A vacuum cylinder is preferred over other actuating apparatus, such as an air cylinder, in order to minimize particle generation. Catcher 42 will slide inward and outward on guides 50 and 52 in response to actuating cylinder 60. Guides 50 and 52 and bores 56 and 58 assure that the sliding action of catcher 42 will be straight in relation to the longitudinal axis of the effector 10.

An elongate rectangular flag 64 is affixed to a terminal flat section of sensor rod 54. Flag 64 may be adjustably affixed to rod 54 as by means of a slot 66 and a screw 68. Flag 64 interacts with a pair of optical sensors 70 and 72. Sensors 70 and 72 are mounted to housing 26 by suitable means such as a bracket 74. Each sensor 70 and 72 is formed in a U-shape with the visible portion of the U extending above the plane of flag 64, and the lower portion of the U-shape (not shown) extending below the plane of flag 64. On one leg of each "U", a light emitting diode is mounted, while on the other leg of each "U", a phototransistor is mounted. Flag 64 is operable to selectively occlude the light path between the upper legs of "U" sensors 70 and 72 from the lower legs thereof.

When catcher 42 is retracted as shown, the edge 76 of flag 64 is disposed between sensor 70 and sensor 72. In this position, flag 64 occludes the light path between the upper and lower legs of sensor 72, but does not occlude the light path between the upper and lower portions of sensor 70. Suitable communication lines (not shown) connect sensors 70 and 72 to a computer that controls effector 10 and robot arm 12. In the illustrated position, the computer is informed that catcher 42 is in a fully retracted position.

When the catcher 42 is in its fully extended position, flag 64 is drawn outwardly such that its inner edge 78 is disposed between sensors 70 and 72. In this condition, the light path between the components of sensor 72 is not occluded, while the light path between the components of sensor 70 is. This indicates to the controlling computer that catcher 42 is in its extended, indexing position, as shown in FIG. 1. When catcher 42 is in between these two positions, both sensors 70 and 72 have occluded light paths, indicating to the controlling computer that the catcher 42 is in an intermediate position.

Bidirectional vacuum cylinder 60 has a pair of vacuum leads (not shown) that are switched at a point remote from effector 10 to actuate the movement of pusher rod 48. A vacuum is selectively applied to these leads responsive in part to the position of flag 64. One vacuum connection is made at an outer port 80 of cylinder 60, and the other vacuum connection is made at an inner port 82.

Vacuum ports 38 on platform 28 are the outlets of a pair of channels 84 and 86 (shown in phantom) that are preferably formed within the body of platform 28. Channels 84 and 86 can, for example, be fabricated by machining channels in lower plate 30 (FIG. 1), and then covering up the open upper sides of channels 84 and 86 by the attachment of upper plate 34 to lower plate 30.

Right channel 86 extends back underneath housing 26 to a vertical bore 88. Channel 84 likewise extends through platform 28 and housing bottom 32 to a point across from bore 88, and then makes a cross connection through bottom 32 to bore 88. Bore 88 is in turn connected to an horizontal bore 90. A vacuum fitting 92 is screwed into bore 90, and a vacuum line (not shown) is attached to the fitting 92.

In one embodiment, a vacuum switch (not shown) is mounted on the rear of housing 26 opposite vacuum fitting 92. Alternatively, the vacuum switch can be mounted or made a portion of switching apparatus located on the robot arm or elsewhere. A vacuum sensor (not shown) is preferably incorporated into this vacuum switch, and is operable to sense the presence of a vacuum at ports 38 due to the positioning of a slice across ports 38 on upper plate 34.

The materials used for fabricating effector 10 should be selected from substances that do not generate a large number of contaminating particles. When effector 10 is built out of substances that have a low particulate generation, the contamination of the slice which it carries will be decreased. In the illustrated embodiment, the exterior of housing 26 is finished in a hard enamel. Platform 28 is preferably formed of a metal such as stock steel and is flat ground. It is finished with a nickel oxide coated surface. One vendor of such surfaces is General Magnaplate, of Arlington, Texas, which sells a NIDOX coating. The exposed metal surfaces also can be hard-anodized aluminum or finished with TUFRAM, a hard anodization with a teflon impregnation. Body 44 of catcher 42 is preferably fabricated of a hard plastic such as DELRIN, a tough plastic that has good wear characteristics.

Turning now to FIGS. 3a-3e, a plurality of steps in a slice-positioning and transporting process according to the invention are shown. FIG. 3a illustrates the beginning steps in transferring a slice S from a cassette 100 to another location (see FIG. 3e).

Cassette 100 has a plurality of racks 102. The illustrated cassette 100 has its racks 102 completely filled with silicon slices, including a slice S.

At the beginning of the process platform 28 is in a horizontal position. Robot arm 12 inserts platform 28 into cassette 100 underneath slice S. Platform 28 is dimensioned so as to be able to be inserted into cassette 100. At some point prior to picking up the slice, the vacuum source for vacuum ports 38 is turned on such that there is a continuous suction at these ports.

Turning now to FIG. 3b, robot arm 12 lifts platform 28 upwardly such that slice S is supported on platform 28. In particular, enough of platform 28 is inserted underneath slice S to give stable support to slice S, particularly forks 36 (FIG. 3a). Once slice S makes contact with upper plate 34 of platform 28, the suction from ports 38 affixes slice S in place relative to platform 28. Further, capacitive sensor 40 (FIG. 3a) senses the presence of slice S over it. A vacuum sensor connected to the vacuum source for ports 38 may also sense the presence of slice S on upper surface 34. Next, arm 12 is manipulated to withdraw platform 28, effector 10 and slice S from cassette 100.

Referring next to FIG. 3c, effector 10 and platform 28 are tilted upwardly away from the horizontal such that slice S is in an inclined plane and above catcher 42. At this step, it is preferred that the vacuum into ports 38 still be switched on such that slice S will adhere to a position on the end of platform 28. This tilting action can take place either while arm 12 is in a stationary position, or while arm 12 is moving from cassette 100 to another desired position. The releasable affixation of slice S to blade 28 by the vacuum allows this to be possible, thus providing an additional advantage of the invention. Other methods of affixing slice S to platform 28 may be used, the illustrated use of a partial vacuum merely being preferred.

Turning next to FIG. 3d, cylinder 60 (FIG. 2) is actuated inside of housing 26 to push pusher rod 48 and catcher 42 forward to a predetermined indexing position. As previously explained, the indexing position is sensed by the position of a flag 64 (FIG. 2) on sensor rod 54. While in the indexing position, catcher 42 defines a plurality of indexing points that fit a sidewall 104 of slice S. In most instances, silicon slice S will mostly be circular, with one flat side turned away from effortor 10, and the forward surface 46 of catcher 42 will therefore be a circularly concave segment. However, the invention is not limited to centering disc-like objects, but can be applied to any object that requires centering or aligning with respect to indexing points. In these other applications, the shape of the forward surface 46 of catcher 42 would be changed to correspond to the contour presented to catcher 42 by the workpiece being centered or aligned. It is preferred that the catcher 42 define at least two or three indexing points, and that at least two of these indexing points be laterally displaced from the axis of sliding motion of the workpiece.

While in the illustrated embodiment catcher 42 is extended after effector 10 has been rotated up into an inclined position, but before the vacuum source coupled to ports 38 has been turned off, this need not necessarily be the case. Catcher 42 can be extended while effector 10 and platform 28 are still in a horizontal position, or could be extended after the vacuum source connected to ports 38 is turned off, thus pushing slice S back into an indexed position. This is less preferable than the illustrated embodiment for the application of integrated circuit manufacturing, as more friction and therefore more particle generation would be obtained between slice S and the upper surface 35 (FIG. 1) of platform 28.

Catcher 42 is extensible and retractable in the illustrated embodiment in order to prevent its physical conflict with locations in which blade 28 is designed to enter. In applications where no such physical conflict exists, catcher 42 need not be extensible and retractable, but can be fixed permanently in an indexing position.

In the illustrated embodiment, the vacuum source connected to ports 38 is turned off subsequent to catcher 42 being extended forward into an indexing position. Responsive to the cessation of vacuum at ports 38, slice S will slide slightly downward and will be indexed by catcher 42. This perfectly aligns slice S with catcher 42, and therefore effector 10 and arm 12. The robot knows the precise location of its arm 12 and effector 10, and thus now knows exactly where slice S is in relation to it. The robot can therefore place slice S with precision at any desired location. After slice S is positioned in relation to catcher 42, vacuum ports 38 are preferably turned back on in order to reaffix slice S to blade 28.

Referring now to FIG. 3e, the final steps in the transportation and centering process are illustrated. Catcher 42 is preferably retracted to a rest position either before or after pivot 14 returns blade 28 to a horizontal position. During or after this time, robot arm 12 moves effector 10 to the second location, in the illustrated embodiment comprising a hotplate bake machine indicated generally at 106.

Robot arm 12 next lowers blade 28 and slice S down on posts 108-112 of bake machine 106. One of the posts, post 108, is in the center line of robot arm 12's motion. Blade 28 is lowered past the upper point of center post 108, which passes between forks 36 within a channel provided within capacitor sensor element 40 (FIG. 2). In this way, slice S can be placed on top of bake machine 106 while physically avoiding supporting post 108.

Referring next to FIG. 3f, an alternate destination for slice S is shown, in this case a photoresist spinner indicated generally at 113. Parts have been broken away for clarity.

Spinner 113 includes a spinner chuck 114 that is preferably in the form of a circular disc having a diameter substantially less than slice S. A chuck support shaft 115 is affixed to the center of the bottom of disc 114, and is operable both to impart rotational motion to disc 114 and to raise and lower it. Shaft 115 is elevated to the position shown in order to receive a slice S, and is retracted into a photoresist cup 116 in preparation for spinning on photoresist onto the top surface of slice S.

FIG. 3f shows effector 10 during the placement of a slice S on the top surface of spinner chuck 114. During this operation, the effector forks (not shown) are advanced around the diameter of spinner chuck 114 so as to avoid touching spinner chuck 114, while at the same time supporting slice S as it is centered over chuck 114. For this purpose, each fork 36 has an interior arcuate margin 117 (see FIG. 2) formed to be spaced away from the perimeter of spinner chuck 114 in this position. After effector 10 has centered slice S over spinner chuck 114, the robot arm 12 lowers the effector 10 to disengage upper surface 34 from slice S, and then retracts effector 10 from the workstation.

It should be noted that only selected parts of the spinner workstation have been shown. The spinner chuck 114 and the resist cup 116 typically reside in an enclosure 119. In the illustrated embodiment, the enclosure has a slot 121 through which platform 28 and slice S are inserted, the platform thereafter being withdrawn. To retrieve slice S from spinner chuck 114, the platform 28 is advanced below slice S and around chuck 114, the platform 28 then raised until the forks support slice S and the vacuum ports hold the slice S in place, and the platform laterally withdrawn.

An important technical advantage of the invention is obtained in relation to high-speed spinning devices such as spinner 113 in that slice S can be placed by a robot with precision thereon. The center of slice S and the axis of rotation will therefore be perfectly aligned, and the spinning of photoresist or other such materials on to the upper surface of slice S will be more perfectly performed.

Referring now to FIG. 4, an alternate embodiment of the invention is shown in an isometric view at 120. A robot arm 122 and a pivot 124 are substantially similar to the embodiment shown in FIG. 1, as are attaching collar 126 and effector housing 128. Platform or blade 130 is in general similar to blade 28 of the embodiment shown in FIG. 1. Platform 130 has a pair of vacuum ports 132 and a capacitive sensor 134. Platform 130 further has a raised upper surface 136 that is raised above the general upper surface 138 of platform 130. Raised upper surface 136 is provided such that the edge or sidewall of a slice positioned thereon will not be contacted by the effector 120, and only a central portion of the bottom surface of the slice will be touched by platform 130. Raised surface 136 is dimensioned to be less in all lateral dimensions than the diameter of the slice it is designed to pick up.

As in the embodiment shown in FIG. 1, a pusher rod 140 is affixed to the rear of a block 142 of a catcher apparatus indicated generally at 144. Pusher rod 140 is affixed to the end of a piston (not shown) which reciprocates inside of a vacuum cylinder 146 in a manner similar to the vacuum cylinder 60 shown in FIG. 2. A sensor arm 148 is also affixed to block 142, and provides the same catcher position sensing function as does sensor arm 54 shown in FIG. 1.

The principal differences in construction between the embodiment shown in FIG. 4 and that in FIG. 1 lie in the catcher apparatus 42 (FIG. 1) and catcher apparatus 144 (FIG. 4). Catcher 144 has a block 142 formed in a "U" shape. Block 142 has a pair of lateral arms 150, on the terminal ends of which are formed orifices 152. Each orifice 152 receives a respective pin 154 that is partially shown in phantom. Pins 154 are preferably fabricated of stainless steel.

Catcher 144 further has a pair of elongate calipers 156 and 158. Each caliper 156 and 158 is hingedly connected to platform 130 by a pin 160 which is best shown in FIG. 5a. It is preferred that pins 160 be laterally spaced inward from catcher arms 150, but spaced outward from the longitudinal center line of the effector 120. The outer portions of calipers 156 and 158 form concave curved surfaces 162 and 164 that are designed to mate with the sidewall of a silicon slice when catcher 144 is in the indexing position, as is shown in FIG. 4.

Left caliper 156 has a slot 166 that is formed between its ends for slideably receiving the end of a respective yoke pin 154. Right caliper 158 likewise has a slot 168 for slideably receiving a respective yoke pin 154. The ends of stainless steel pins 154 preferably do not extend beyond the depths of slots 166 and 168 of calipers 156 and 158. Calipers 156 and 158 and catcher block 142 are preferably fabricated of tough plastic materials, such as those sold under the trademarks DELRIN or ERTALYTE.

Turning now to FIGS. 5a and 5b, plan views of an embodiment slightly different from that shown in FIG. 4 are shown. Like numbers identify parts like those shown in FIG. 4 wherever possible.

In FIG. 5a, the illustrated embodiment has a platform or blade 130 that has a circular outer lateral perimeter 172. In place of two elongate vacuum ports 132 (FIG. 4), there are provided four vacuum ports 174, two on each arm 176 of platform 130. Capacitor sensor element 34 is disposed rearwardly of its location in the embodiment shown in FIG. 4. Catcher 144 as shown in FIGS. 5a and 5b is substantially similar to the catcher 144 shown in FIG. 4.

FIG. 5a shows catcher 144 in a forward, or indexing, position. In this position, caliper arms 156 and 158 are pivoted forward, and indexing surfaces 162 and 164 are in a position to mate with the sidewall of a semiconductor slice. Preferably, arms 156 and 158 are pivoted forward by block 142 sometime before the slice is released from vacuum ports 174. The slice will then nest between indexing surfaces 162 and 164, and the partial vacuum into ports 174 will be turned back on.

Catcher 144 will then be retracted into a rest position, as shown in FIG. 5b. As shown, block 142 has now been retracted through the action of vacuum cylinder 146. This causes stainless steel pins 154 to move within slots 166 and 168, in turn causing calipers 156 and 158 to pivot backward to a non-indexing or resting position. In this position, calipers 156 and 158 do not interfere with any blade-inserting motion that may be required, as for example the insertion of blade 130 underneath a slice in cassette 100 (FIG. 3a).

The pivoting catcher mechanism shown in FIGS. 4 and 5a-5b is preferred where limited room exists for the retraction of catcher 144. Using the pivoting mechanism shown, calipers 156 and 158 can be pulled backward further than a straightforward sliding motion would allow. On the other hand, where operating room permits, a simple integral catcher 42, as shown in FIG. 1, is preferred for ease of fabrication and increased indexing accuracy.

In summary, a novel method and apparatus for indexing a workpiece, such as an integrated circuit slice, has been shown and described. The method includes tilting a platform away from the horizontal such that a side of the workpiece slides into an indexing surface of a catcher. Once the side of the workpiece abuts the indexing points of the catcher, its position will be defined relative to the platform. Thereafter, a robot arm or other manipulating apparatus connected thereto can place the workpiece at any desired location with great accuracy.

While preferred embodiments and their advantages have been described in the above detailed description, the invention is not limited thereto but only by the scope and spirit of the appended claims.

What is claimed is:

1. Apparatus for positioning a semiconductor slice relative to a slice carrier, comprising:
   a horizontal platform for supporting a semiconductor slice thereon;
   means for tilting said platform away from the horizontal, thereby to cause sliding of said slice on said platform; and
   an indexer disposed laterally adjacent said platform, and positioned to receive at least one side of said slice thereagainst, such that said slice is positioned on said platform in a predetermined location.

2. The apparatus of claim 1, and further comprising means for releasably affixing the slice to the platform.

3. The apparatus of claim 2, and further comprising:
   means for extending said indexer from a rest position to an indexing position;
   means for releasing said slice from said platform, said platform having a remote end spaced from said indexer and a near end closer to said indexer than said remote end, said means for tilting said platform operable to raise said remote end respective to said near end such that said slice slides toward said indexer, said means for releasably affixing operable to reaffix said slice to said platform after said side of said slice has been received by said indexer.

4. The apparatus of claim 1, and further comprising:
   means for extending said indexer from a rest position to an indexing position;
   means for tilting said platform toward the horizontal after said side is received by said indexer; and
   means for retracting said indexer from said indexing position to said rest position subsequent to said indexing points receiving said side.

5. Apparatus for positioning a slice for integrated circuits relative to an end effector, comprising:
   a platform of said end effector for picking up an integrated circuit slice;
   a pivot coupled to said platform for tilting said platform to and from the horizontal;
   a catcher mounted on said end effector and having at least two indexing points, said pivot operable to tilt said platform such that the said slice slides toward said catcher, said indexing points being laterally spaced away from the center line of sliding motion;
   the slice sliding on said platform responsive to said tilting of said pivot until said slice abuts each of said indexing points, such that said slice is in a predetermined position relative to said end effector.

6. The apparatus of claim 5, and further comprising:
   a holder for releasably affixing the slice to said platform prior to and subsequent to sliding the slice toward said catcher.

7. The apparatus of claim 6, wherein said platform has an upper surface, the workpiece having a lower surface, said holder comprising a plurality of vacuum ports disposed in said upper surface, said vacuum ports operable to create a partial vacuum between the lower surface of the workpiece and said upper surface, a vacuum source in communication with said vacuum ports, said vacuum source operable to be switched off in order to release the slice from said platform, said vacuum source operable to be switched on in order to reaffix the slice to said platform.

8. The apparatus of claim 7, wherein said vacuum source is operable to be switched on prior to said pivot tilting the platform away from the horizontal, said vacuum source thereafter switched off to release the slice and allow the slice to slide toward and abut said catcher, said vacuum source operable to be switched back on once said side of said slice abuts against said indexing points.

9. The apparatus of claim 7, and further comprising a vacuum sensor coupled to said ports for sensing the presence of a partial vacuum thereat, such that the presence of a slice on said platform may be sensed.

10. The apparatus of claim 5, and further comprising:
    a slide for laterally sliding said catcher from a rest position to an indexing position, said slide operable to retract said catcher from said indexing position to said rest position subsequent to abutting the slice side against said indexing points.

11. The apparatus of claim 10, and further comprising a sensor for sensing the position of said slide relative to said end effector.

12. The apparatus of claim 10, wherein said catcher comprises an indexing surface that includes said indexing points, said indexing surface pushed forward toward said slice into said indexing position by said slide, said surface retracted to said rest position by said slide.

13. The apparatus of claim 12, wherein said indexing surface is a concave surface formed to match a sidewall of said slice.

14. The apparatus of claim 10, wherein said catcher comprises a plurality of calipers each having at least one indexing point, said calipers pivotally coupled to said slide, said calipers each operable to pivot forward to assume a respective indexing position when said slide is extended, each said caliper operable to pivot backward to a respective rest position when said slide is retracted.

15. The apparatus of claim 14, wherein said plurality of calipers comprise a pair of calipers each having a concave surface containing at least one indexing point, said concave surface adapted to match a portion of the slice when a respective caliper is in its indexing position.

16. The apparatus of claim 14, and further comprising:
 a yoke mounted to a remote end of said slide, said yoke having a first pin for a first caliper and a second pin for a second caliper, said pins laterally spaced from said side;
 an inner end of each said caliper pivotally mounted to said platform, an outer portion of each said caliper remote from said inner end and including at least one said indexing point;
 a laterally elongate orifice in each caliper disposed between said inner end and said outer portion for receiving a respective yoke pin, said yoke pin sliding within said elongate orifice during the extension or retraction of said catcher.

17. The apparatus of claim 5, wherein said platform includes a capacitive sensor for sensing the presence of a slice on said platform.

18. The apparatus of claim 5, wherein an end effector plate is formed to couple said pivot to said platform, said platform comprising an extension of said end effector plate remote from said pivot, an upper surface of said platform formed in raised relation above an upper surface of said effector plate, said upper surface of said platform dimensioned to be less than the diameter of said slice such that the sides of said slice will not be touched by the platform upper surface.

19. The apparatus of claim 5, wherein said platform comprises a pair of laterally spaced forks projecting away from said catcher, a space between said forks formed in said platform such that said forks may be placed around a post situated underneath the slice.

20. The apparatus of claim 5, wherein said platform comprises a pair of laterally spaced forks projecting away from said catcher, a space between said forks formed in said platform such that said forks may be placed at least partly around a disk disposed beneath the slice.

21. A system for transferring a slice for integrated circuits from a first workstation to a second workstation, comprising:
 an end effector mounted on a manipulating arm by means of a pivot;
 a platform of said end effector disposed distally from said pivot for supporting a slice thereon, said arm and said effector operable to pick up a slice from said first workstation;
 said pivot operable to pivot said platform away from the horizontal subsequent to picking the slice up from the first workstation;
 a catcher of said end effector having at least two indexing points, said slice sliding towards said catcher along a center line of sliding motion on said platform responsive to the operation of said pivot, said indexing points spaced laterally from said center line;
 said slice abutting said indexing points at the terminus of its slide such that said slice is in a predetermined position relative to said end effector;
 said pivot operable to pivot said platform toward the horizontal after said slice abuts said catcher;
 said arm operable to travel from said first workstation to said second workstation with said slice; and
 said platform operable to place said slice at said second workstation.

22. A method for positioning an integrated circuit slice relative to an end effector, comprising the steps of:
 picking up the slice on a platform of the effector;
 tilting the platform away from the horizontal;
 sliding the slice toward a catcher responsive to said step of tilting, said catcher having at least two indexing points laterally spaced from the center line of sliding motion; and
 abutting a side of the slice against the indexing points such that the slice is in a predetermined position relative to the effector.

23. The method of claim 22, and further including the steps of:
 releasably affixing the slice to the platform prior to said step of tilting the platform away from the horizontal; and
 releasing the slice from the platform subsequent to said step of tilting the platform in order to cause the slice to slide toward the catcher.

24. The method of claim 23, wherein said step of releasably affixing the slice is performed by causing a partial vacuum between a lower surface of the slice and a plurality of vacuum ports disposed on an upper surface of the platform, said step of releasing the slice comprising the further step of switching off the vacuum.

25. The method of claim 23, and further including the step of releasably affixing the slice to the platform after said step of abutting the side of the slice against the indexing points of the catcher.

26. The method of claim 25, and further including the steps of:
 switching on a vacuum source in communication with the vacuum ports prior to said step of picking up the slice; and
 sensing the establishment of a vacuum between the lower surface of the slice and the vacuum ports to thereby sense that the slice is on the platform.

27. The method of claim 25, and further including the steps of:
 extending the catcher to an indexing position prior to causing the slice to slide.

28. The method of claim 27, and further including the step of:
 sensing the position of the catcher in order to determine if it has reached the indexing position.

29. The method of claim 22, and further including the steps of:

extending the catcher toward the slice to an indexing position prior to causing the slice to slide.

30. The method of claim 29, and further including the step of sensing the position of the catcher to determine whether the catcher has reached the indexing position.

31. The method of claim 22, and further including the step of:

sensing a change in capacitance using a capacitive sensor mounted on the platform in order to determine whether the slice is on the platform.

32. A method for transferring a slice for integrated circuits from a first location to a second location by remote control, comprising the steps of:

picking up the slice from the first location on a platform of an effector;

withdrawing the effector from the first location;

tilting the platform away from the horizontal;

sliding the slice toward a catcher of the effector responsive to said step of tilting, said catcher having at least two indexing points laterally spaced from the center line of sliding motion;

abutting a side of the slice against the indexing points such that the slice is in a predetermined position relative to the effector;

tilting the platform toward the horizontal;

moving the effector to the second location; and placing the slice precisely at the second location using the predetermined position of the slice relative to the effector 33. The method of claim 32, wherein either said first or said second location has a post extending upwardly into the path of movement of the end effector to the location, said step of picking up the slice or of placing the slice including the further step of moving a plurality of spaced forks of the platform around the post such that the forks are underneath the slice.

34. The method of claim 32, wherein either said first or said second location has a disk surface disposed for supporting the slice, the diameter of the surface less than the diameter of the slice, said step of picking up the slice or of placing the slice including the further steps of moving a pair of spaced forks of the platform around the disk and subsequently raising or lowering the platform.

* * * * *